(12) United States Patent
Kimura et al.

(10) Patent No.: US 7,061,320 B2
(45) Date of Patent: Jun. 13, 2006

(54) DIFFERENTIAL AMPLIFIER

(75) Inventors: Hiroshi Kimura, Hyogo (JP); Shigeki Furuya, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 160 days.

(21) Appl. No.: 10/893,869

(22) Filed: Jul. 20, 2004

(65) Prior Publication Data

US 2005/0017808 A1  Jan. 27, 2005

(30) Foreign Application Priority Data

Jul. 25, 2003  (JP)  ............................. 2003-279707

(51) Int. Cl.
  *H03F 3/45* (2006.01)
(52) U.S. Cl. ...................... 330/255; 330/253
(58) Field of Classification Search ................ 330/255, 330/253, 257, 263
  See application file for complete search history.

(56) References Cited

U.S. PATENT DOCUMENTS

| | | | |
|---|---|---|---|
| 4,524,328 A | | 6/1985 | Abou et al. |
| 5,039,953 A | * | 8/1991 | Su ............................. 330/264 |
| 5,053,718 A | | 10/1991 | Graeme et al. |
| 5,530,444 A | | 6/1996 | Tice et al. |
| 5,783,970 A | | 7/1998 | Pleitz |
| 6,384,685 B1 | * | 5/2002 | Juang ......................... 330/264 |
| 6,414,552 B1 | * | 7/2002 | Kronmueller et al. ...... 330/288 |

FOREIGN PATENT DOCUMENTS

JP  10-64261  3/1998

OTHER PUBLICATIONS

Leung, D. L. C. et al., "A 3-V 45-Mw CMOS Differential Bandpass Amplifier for GSM Receivers", Proceeding of the 1998 IEEE International Symposium on Moneterey, May 31, 1998, pp. 341-344.

* cited by examiner

*Primary Examiner*—Henry Choe
(74) *Attorney, Agent, or Firm*—McDermott Will & Emery LLP

(57) ABSTRACT

A differential amplifier according to the present invention comprises, in addition to a differential amplifier circuit and an output-stage amplifier circuit, a first source follower circuit for buffering a first output signal of the differential amplifier circuit, a second source follower circuit for buffering the first output signal of the differential amplifier circuit, and a source ground amplifier circuit, to a source of which an output terminal of the second source follower circuit is connected, and driven by a second output signal of the differential amplifier circuit, wherein a first-polar transistor in the output-stage amplifier circuit is driven by an output signal of the first source follower circuit, and the second-polar transistor is driven by an output signal of the source ground amplifier circuit.

22 Claims, 17 Drawing Sheets

DIFFERENTIAL AMPLIFIER

BACKGROUND OF THE INVENTION

1. Field of the Invention

The present invention relates to a differential amplifier for amplifying and communicating an analogue signal and a test circuit having the differential amplifier installed therein.

2. Description of the Related Art

In general, a bipolar transistor or BiCMOS transistor is used for a differential amplifier. In recent years, there has been an increasing demand for a system-on-chip configuration and reduction of power consumption, in response to which the CMOS has been widely used. The differential amplifier of the CMOS configuration is expected to satisfy requirements such as low distortion and high-speed operation.

FIG. 14 shows an example of a conventional differential amplifier of the CMOS configuration capable of class A output. The differential amplifier has a two-stage configuration, wherein an output-stage amplifier circuit A2 is connected to a terminal for an output signal DiffOUT of an input-stage differential amplifier circuit A1. The differential amplifier A1 is comprised of a constant current source E1, an input transistor Tr1, wherein a positive-side input signal INP is applied to a gate, an input transistor Tr2, wherein a negative-side input signal INM is applied to a gate, and transistors Tr3 and Tr4 for load resistance. The amplifier circuit A2 is comprised of a constant current source E2, a transistor Tr5 for amplification, and a phase compensation capacity C1, and generates and outputs an output signal OUT.

In the differential amplifier, when a resistive load is connected to an output terminal of the amplifier circuit A2, a current flow with respect to the transistor Tr5 decreases, resulting in signal communication at a lower speed. As a result, responses of the differential amplifier tend to be oscillatory.

When the resistive load is connected, a differential amplifier capable of class AB output with a source follower circuit or source ground amplifier circuit additionally installed therein is generally used, an example of which is shown in FIG. 15. In a first source follower circuit A4, the output signal DiffOUT of the differential amplifier A1 is applied to a gate of a transistor Tr6 for amplification, wherein a source is connected to a constant current source E3. Further, in an amplifier circuit A3, an antipolar transistor Tr7 is connected to a transistor Tr8. To a gate of the upper-side transistor Tr7 is applied a positive-side output signal OUTP from the first source follower circuit A4. A drain connection point, at which drains of the transistors Tr7 and Tr8 are connected to each other, serves as an output terminal.

In the foregoing configuration, a signal is communicated to both the transistors Tr7 and Tr8. Therefore, one of the transistors responds poorly, a responsiveness of the other transistor can be maintained. As a result, the connection of the resistive load to an output terminal of the amplifier circuit A3 does not deteriorate the response of the differential amplifier.

In FIG. 16, a grounded-source amplifier circuit A5 is further added. In a circuit shown therein, providing that the amplifier circuit A3 has a push-pull configuration to thereby enlarge an amplitude of an output signal, a waveform distortion can be controlled.

However, the class-AB differential amplifier, because of its number of stages larger than that of the class A differential amplifier, is unsuitable for a high-speed operation. When the output-stage transistors Tr7 and Tr8 are increased in size in order to improve the capability of the differential amplifier, the output signal DiffOUT becomes an excessive load, thereby decreasing the operation speed. In the case of FIG. 16, the transistors Tr7 and Tr8 respectively have different drive signals, which easily leads to the deterioration of the waveform of the output signal.

BRIEF SUMMARY OF THE INVENTION

The differential amplifier according to the present invention comprises:

an input-stage differential amplifier circuit having a first and a second input terminals and a first and a second output terminals;

a first source follower circuit having a first-polar transistor, wherein the first output terminal of the differential amplifier circuit is connected to a gate;

a second source follower circuit having a first-polar transistor, wherein the first output terminal of the differential amplifier circuit is connected to a gate;

a source ground amplifier circuit having a first-polar transistor, wherein an output terminal of the second source follower circuit is connected to a source, the second output terminal of the differential amplifier circuit is connected to a gate, and a load resistance is connected to a drain; and an output-stage amplifier circuit having a first-polar transistor, wherein an output terminal of the first source follower circuit is connected to a gate, and a second-polar transistor, wherein an output terminal of the source ground amplifier circuit is connected to a gate, serially connected to each other.

According to the foregoing configuration, a drive signal of the first-polar transistor in the output-stage amplifier circuit is buffered by the first source follower circuit, and a drive signal of the second-polar transistor is buffered by the second source follower circuit and source ground amplifier circuit. In brief, those two drive signals are both buffered. Therefore, when the transistors are both increased in size in order to improve the capability thereof, a band represented by the differential amplifier is not narrowed. Further, because the drive signals are both produced from signals of the input-stage differential amplifier circuit, an output signal waveform of the output-stage amplifier circuit can be prevented from deteriorating.

In the differential amplifier having the foregoing configuration, it is preferable for the differential amplifier circuit to comprise:

a constant current source;

a first-polar first input transistor, wherein a source is connected to the constant current source and the first input terminal is connected to a gate;

a first-polar second input transistor, wherein a source is connected to the constant current source and the second input terminal is connected to a gate;

a first load resistance connected to a drain of the first input transistor; and a second load resistance connected to a drain of the second input transistor.

It is also preferable to configure the differential amplifier circuit in the manner that linear resistances are respectively inserted between the source of the first input transistor and the constant current source, and between the source of the second input transistor and the constant current source. According to the foregoing configuration, a source negative feedback circuit using the linear resistances is connected to a differential pair comprised of the first and second input transistors. As a result, a linearity of the differential pair is enhanced, and the waveform can be further improved.

As a different mode of the source negative feedback circuit using the linear resistances, the following configuration may be employed.

The differential amplifier circuit comprises:

a first constant current source;

a second constant current source;

a first-polar first input transistor, wherein a source is connected to the first constant current source and the first input terminal is connected to a gate;

a first-polar second input transistor, wherein a source is connected to the second constant current source and the second input terminal is connected to a gate;

a first load resistance connected to a drain of the first input transistor;

a second load resistance connected to a drain of the second input transistor; and a linear resistance inserted between the source of the first input transistor and the source of the second input transistor. In the foregoing configuration, as in the earlier case, the source negative feedback circuit using the linear resistance is connected to the differential pair. As a result, the linearity of the differential pair can be enhanced, and the waveform can be further improved.

The linear resistance inserted between the sources of the first and second input transistors may be comprised of a parallel connection unit of two transistors, and gates of the parallel connection unit are respectively connected to the first and second input terminals. In such a configuration, it becomes unnecessary to use a resistance element of a high precision.

Further, in the foregoing configuration, the respective first and second load resistances in the differential amplifier circuit may be comprised of diode connectors of transistors. This configuration negates a nonlinear characteristic of the differential pair comprised of the first and second input transistors. In this manner, the linearity of the differential pair can be enhanced, and the waveform can be further improved. Further, it becomes unnecessary to provide a common mode feedback circuit outside the differential amplifier.

In the foregoing configuration, sub load resistances may be respectively connected in parallel to the first and second load resistances in the differential amplifier circuit. This arrangement decreases a current running through the load resistances to thereby improve a differential gain of the input transistors, which consequently enables a drive at a lower voltage. The sub load resistances maybe comprised of the diode connectors of transistors.

A possible configuration of the diode connectors comprising the first and second load resistances is that a gate of one of them is connected to a drain of the other, and a drain of one of them is connected to a gate of the other. According to this configuration, an open gain of the differential amplifier circuit can be prevented from decreasing.

Further, referring to the source ground amplifier circuit, the load resistance included therein may be comprised of a diode connector of the second-polar transistor.

Another possible configuration so as to control the waveform distortion is that linear resistances are respectively inserted between the source of the first-polar transistor in the second source follower circuit and the constant current source, and between the source of the first-polar transistor in the source ground amplifier circuit and the constant current source. This configuration also enhances the linearity of the differential pair and controls the waveform distortion. Further, it is unnecessary to regard the decrease of the open gain of the differential amplifier circuit.

Another possible configuration is that a linear resistance is inserted between a connection point, at which the source of the first-polar transistor in the second source follower circuit and the constant current source are connected to each other, and a connection point, at which the source of the first-polar transistor in the source ground amplifier circuit and the constant current source are connected to each other. The linear resistance is comprised of a parallel connection unit of transistors, wherein gates are respectively connected to the first and second output terminals of the differential amplifier circuit. This configuration also enhances the linearity of the differential pair and controls the waveform distortion. Further, it becomes unnecessary to regard the decrease of the open gain of he differential amplifier circuit and to provide the highly precise resistance element.

An LSI test circuit incorporating the differential amplifier configured in the foregoing manner as an input amplifier or output amplifier for test use is advantageous. In the case of the LSI, an LSI test is implemented without any limitation to a signal amplitude and signal band, and further, an input buffer for shaping an input signal can be reduced.

Additional objects and advantages of the present invention will become apparent from the following detailed description of preferred embodiments thereof, which are best understood with reference to the accompanying drawings.

BRIEF DESCRIPTION OF THE DRAWINGS

In all these figures, like components are indicated by the same numerals

DETAILED DESCRIPTION OF THE PREFERRED EMBODIMENTS

Figure 1:
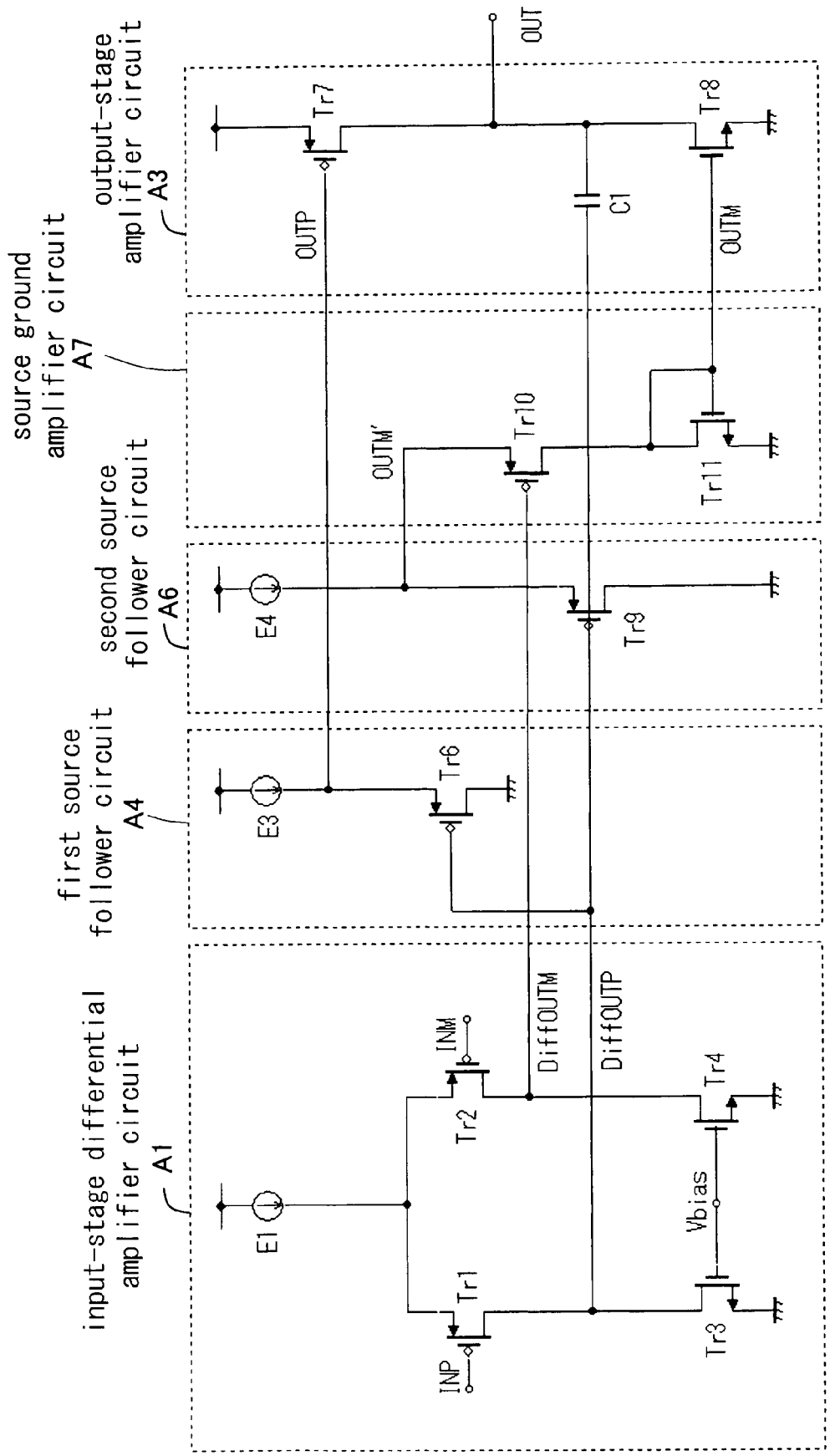
FIG. 1 is a circuit diagram illustrating a configuration of a differential amplifier according to an embodiment 1 of the present invention.

Hereinafter, preferred embodiments of a differential amplifier according to the present invention are described referring to the drawings. In the description, a first polarity of a MOS transistor is represented by P channel, and a second polarity thereof by N channel.

Embodiment 1

As shown in FIG. 1, a differential amplifier according to an embodiment 1 is comprised of an input-stage differential amplifier circuit A1, a first source follower circuit A4, a second source follower circuit A6, a source ground amplifier circuit A7, and an output-stage amplifier circuit A3.

In the differential amplifier circuit A1, a positive-side input signal INP is applied to a gate of a P-channel input transistor Tr1, wherein a source is connected to a constant current source E1, and a drain of an N-channel transistor Tr3 for load resistance is connected to a drain. A negative-side input signal INM is applied to a gate of a P-channel input transistor Tr2, wherein a source is connected to the constant current source E1, and a drain of an N-channel transistor Tr4 for load resistance is connected to a drain. Sources of the transistors Tr3 and Tr4 are grounded, and bases thereof are biased.

In the first source follower circuit A4, a first output signal DiffOUTP of the differential amplifier circuit A1 is applied to a gate of a P-channel transistor Tr6 for amplification, wherein a source is connected to the constant current source E3, and a drain is grounded.

In the second source follower circuit A6, the first output signal DiffOUTP of the differential amplifier circuit A1 is applied to a gate of a P-channel transistor Tr9 for amplification, wherein a source is connected to a constant current source E4, and a drain is grounded.

In the source ground amplifier circuit A7, a second output signal DiffOUTM of the differential amplifier circuit A1 is applied to a gate of a P-channel transistor Tr10 for amplification, and an output signal OUTM' of the second source follower circuit A6 is applied to a source thereof. A drain of the transistor Tr10 is connected to a drain of an N-channel transistor Tr11 for load resistance. The transistor Tr11 has a polarity same as that of a transistor Tr8 in the output-stage amplifier circuit A3. The transistor Tr11 has a diode structure, wherein a source is grounded and a gate and a drain thereof are connected to each other.

In the output-stage amplifier circuit A3, a source of a P-channel transistor Tr7 is connected to a high-potential-side power source, a drive signal OUTP is applied from the first source follower circuit A4 to a gate of the P-channel transistor Tr7, and a drain the P-channel transistor Tr7 is connected to a drain of the N-channel transistor Tr8. A drive signal OUTM is applied from the source ground amplifier circuit A7 to a gate of the transistor Tr8, and a source of the transistor Tr8 is grounded. An output signal OUT is outputted from a drain connection point, at which the drains of the transistors Tr7 and Tr8 are connected to each other. The connection point is connected to a terminal for the first output signal DiffOUTP of the differential amplifier circuit A1 via a phase compensation capacity C1.

In the differential amplifier configured as described, the drive signals OUTP and OUTM of the output-stage transistors Tr7 and Tr8 are both buffered. Therefore, when the transistors Tr7 and Tr8 are increased in size in order to improve the capability, a band represented by the differential amplifier is not narrowed.

The drive signal OUTP of the output-stage transistor Tr7 is a signal resulting from buffering the first output signal DiffOUTP in the first source follower circuit A4. In contrast to that, the drive signal OUTM of the output-stage transistor Tr8 is a signal resulting from amplifying a difference between the signal OUTM', which is the output signal DiffOUTP buffered in the second source follower circuit A6, and the second output signal DiffOUTM, which is an inversion signal of the output signal DiffOUTP, in the source ground amplifier circuit A7. To put it differently, the two drive signals OUTP and OUTM of the output-stage amplifier circuit A3 are both generated from the signals of the differential amplifier circuit A1. As a result, the waveform of the output signal OUT of the amplifier circuit A3 can be prevented from deteriorating.

Embodiment 2

In an embodiment 2 of the present invention, the waveform distortion can be more effectively controlled compared to the embodiment 1, which is hereinafter described referring specific examples.

Figure 2:
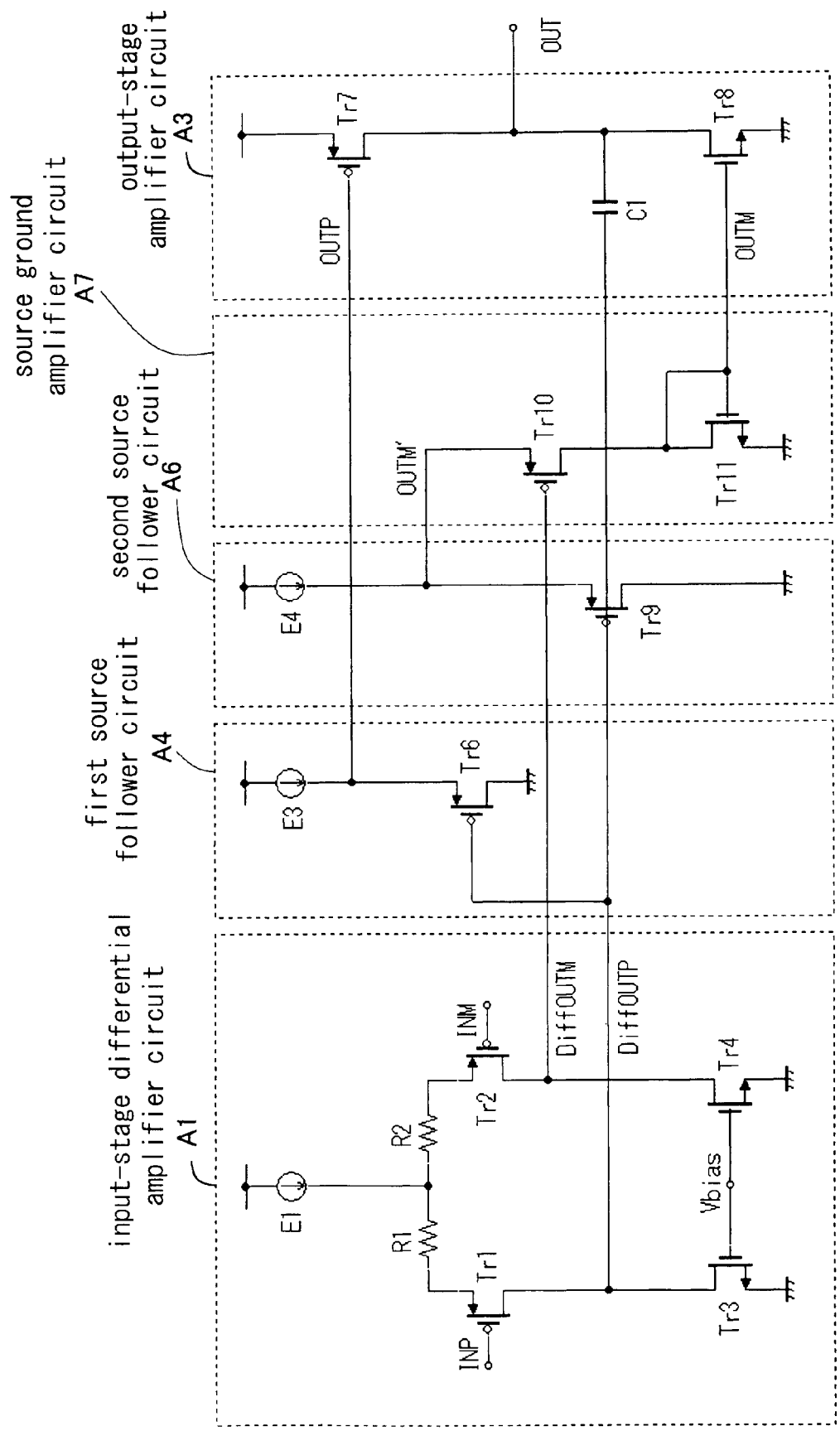
FIG. 2 is a circuit diagram illustrating an example 1 of a configuration of a differential amplifier according to an embodiment 2 of the present invention.

Referring to a differential amplifier shown in FIG. 2, in the differential amplifier circuit A1, a linear resistance R1 is inserted so as to connect the source of the input transistor Tr1 and the constant current source E1, and a linear resistance R2 is inserted so as to connect the source of the input transistor Tr2 and the constant current source E1. Any other component therein, which is identical to the component in FIG. 1, is not described in the present embodiment.

The insertion of the linear resistances R1 and R2 enhances a linearity of a differential pair (Tr1 and Tr2), and further improves the waveform compared to the configuration of FIG. 1.

Figure 3:
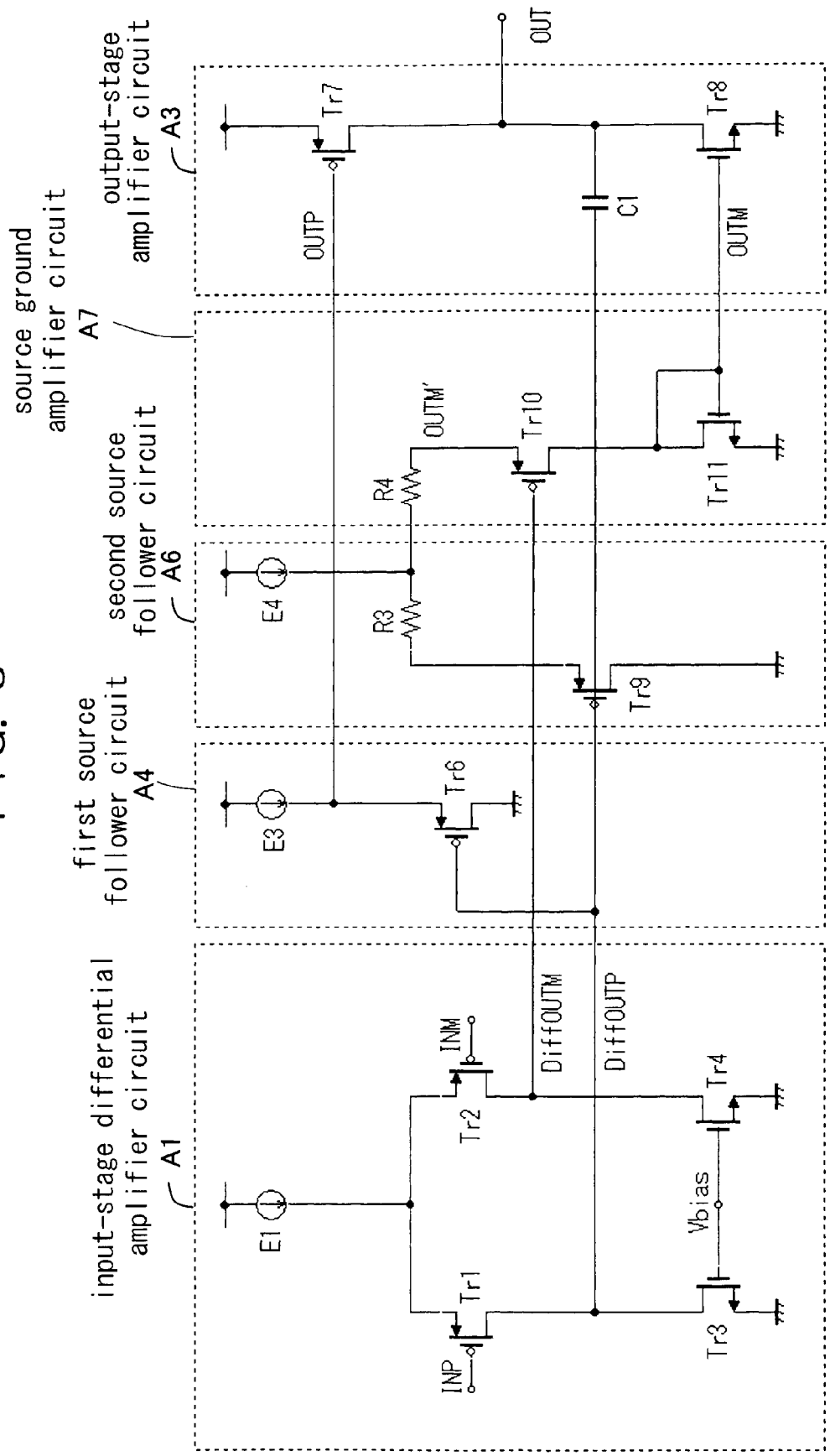
FIG. 3 is a circuit diagram illustrating an example 2 of a configuration of the differential amplifier according to the embodiment 2.

Referring to a differential amplifier shown in FIG. 3, in the second source follower circuit A6, a linear resistance R3 is inserted so as to connect the source of the transistor Tr9 and the constant current source E4, and in the source ground amplifier circuit A7, a linear resistance R4 is inserted so as to connect the source of the transistor Tr10 and the constant current source E4. Any other component therein, which is identical to the component in FIG. 1, is not described in the present embodiment.

The insertion of the linear resistances R3 and R4 enhances a linearity of a differential pair (Tr9 and Tr10), and advantageous in that the decrease of the open gain in the differential amplifier circuit A1 can be disregarded compared to the configuration of FIG. 2.

Figure 4:
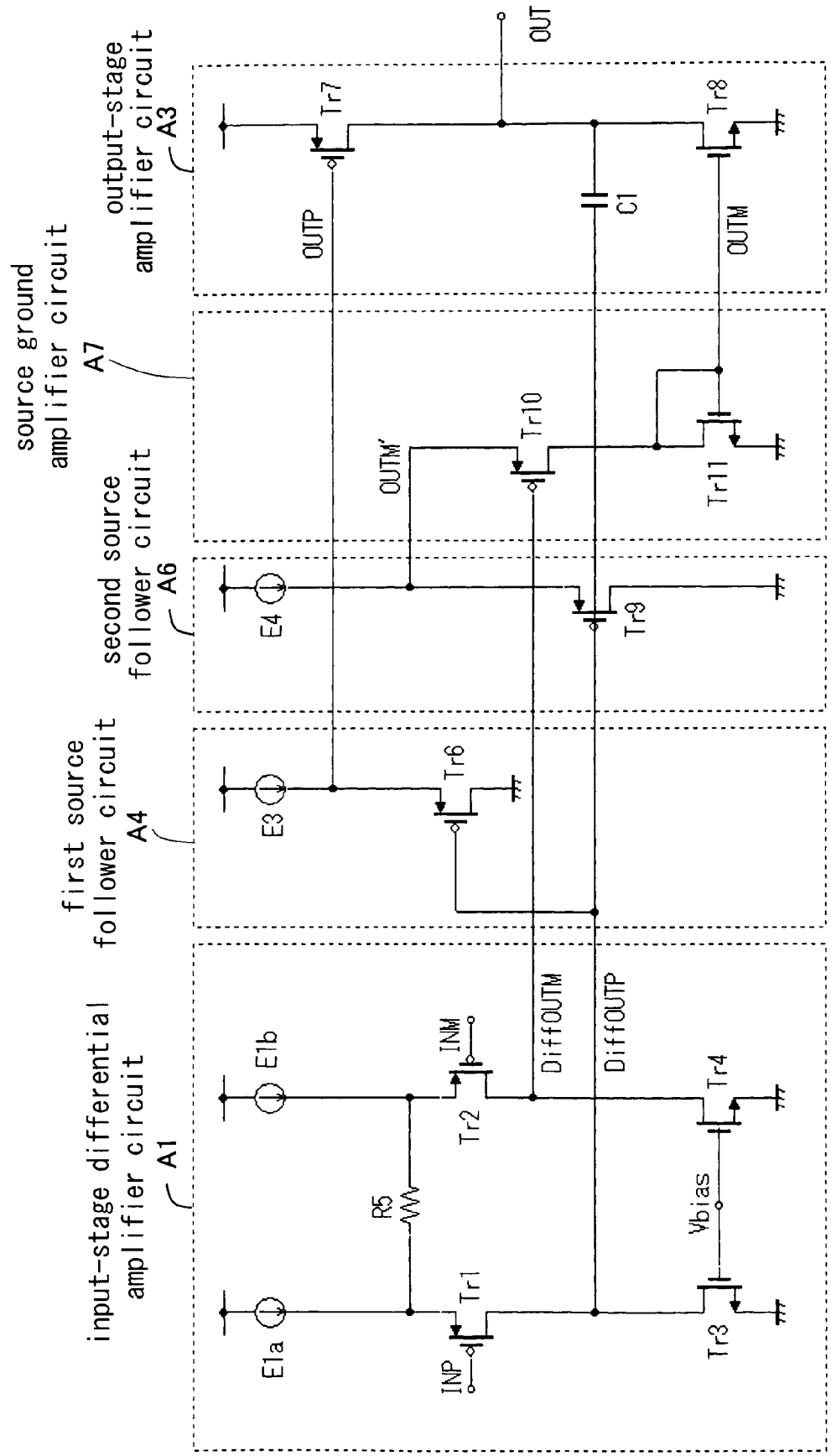
FIG. 4 is a circuit diagram illustrating an example 3 of a configuration of the differential amplifier according to the embodiment 2.

Referring to a differential amplifier shown in FIG. 4, in the differential amplifier circuit A1, wherein the constant current source E1 is divided into a constant current source E1a and a constant current source E1b, and the source of the input transistor Tr1 is connected to the constant current source E1a and the source of the input transistor Tr2 is connected to the constant current source E1b, and further, a linear resistance R5 is inserted so as to connect the sources of the input transistors Tr1 and Tr2. Any other component therein, which is identical to the component in FIG. 1, is not described in the present embodiment.

According to the foregoing configuration, the linearity of the differential pair (Tr1 and Tr2) is enhanced, and further, a wider range of an input voltage can be provided compared to the configuration of FIG. 2.

Figure 5:
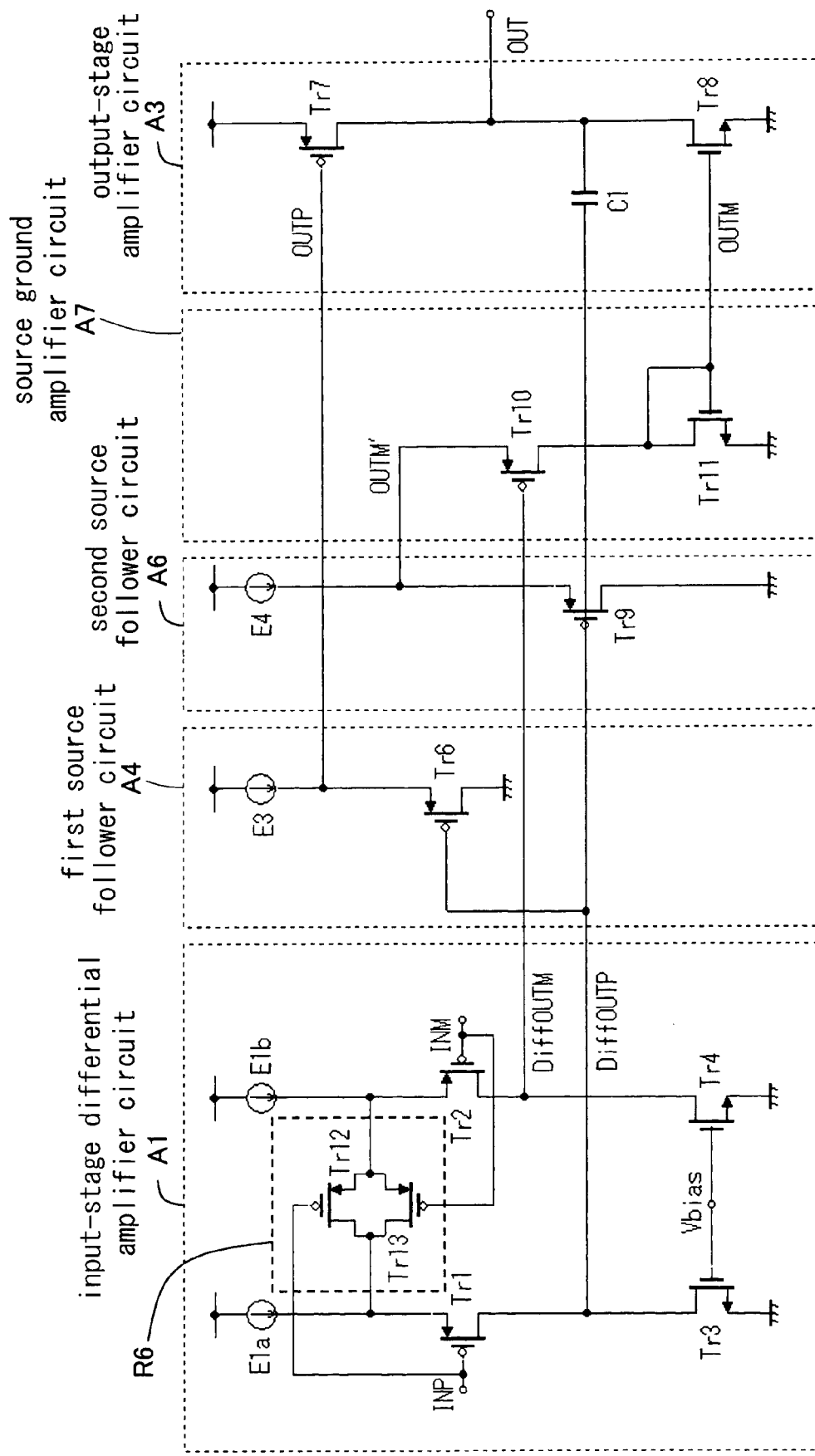
FIG. 5 is a circuit diagram illustrating an example 4 of a configuration of the differential amplifier according to the embodiment 2.

Referring to a differential amplifier circuit shown in FIG. 5, in the differential amplifier circuit A1, a linear resistance connecting the sources of the input transistors Tr1 and Tr2 is configured in a manner different to the linear resistance R5 of FIG. 4. More specifically, a linear resistance R6 connecting transistors Tr12 and Tr13 having a polar same as those of the input transistors Tr1 and Tr2 in parallel is provided. Further, a gate of the transistor Tr12 is connected to the gate of the input transistor Tr1, and a gate of the transistor Tr13 is connected to the gate of the input transistor Tr2. Any other component therein, which is identical to the component in FIG. 1, is not described in the present embodiment.

The foregoing configuration can achieve an effect similar to that of the configuration in FIG. 4, and further eliminates the need to provide the highly precise resistance element used in the configuration of FIG. 4.

Figure 6:
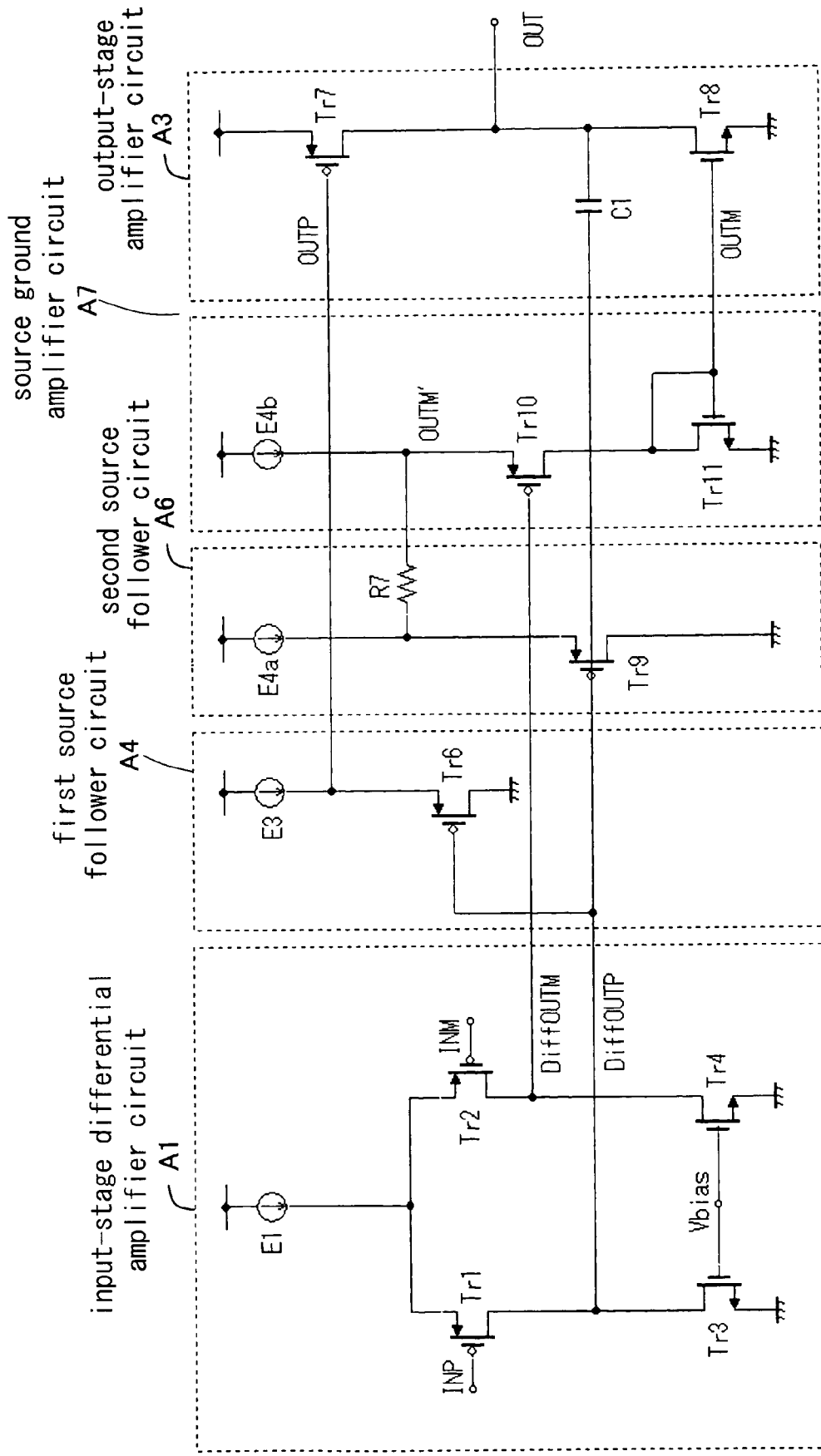
FIG. 6 is a circuit diagram illustrating an example 5 of a configuration of a differential amplifier according to the embodiment 2.

In the case of a differential amplifier shown in FIG. 6, the constant current source E4 is divided into a constant current source E4a and a constant current source E4b, and the source of the transistor Tr9 is connected to the constant current source E4a, and the source of the transistor Tr10 is connected to the constant current source E4b. Further, a linear resistance R7 is provided so as to connect the source of the transistor Tr9 of the second source follower circuit A6 and the source of the transistor Tr10 of the source ground amplifier circuit A7. Any other component therein, which is identical to the component in FIG. 1, is not described in the present embodiment.

According to the foregoing configuration, the linearity of the differential pair (Tr9 and Tr10) is enhanced, and further, a wider range of an input voltage can be provided compared to the configuration of FIG. 3.

Figure 7:
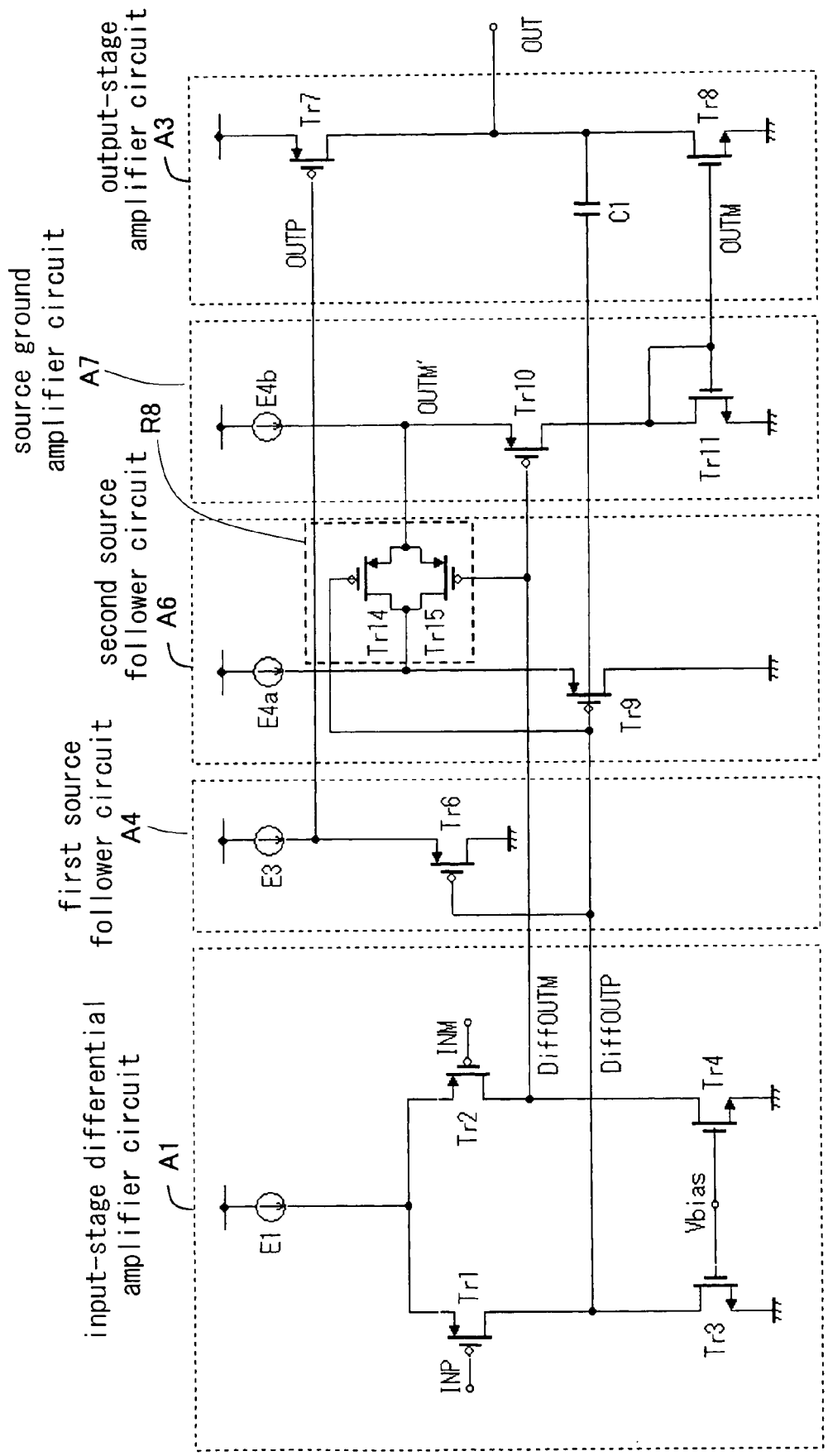
FIG. 7 is a circuit diagram illustrating an example 6 of a configuration of the differential amplifier according to the embodiment 2.

In the case of a differential amplifier shown in FIG. 7, a linear resistance connecting the source of the transistor Tr9 of the second source follower circuit A6 and the source of the transistor Tr10 of the source ground amplifier circuit A7 is configured in a manner different to the linear resistance R7 of FIG. 6. More specifically, a linear resistance R8 connecting transistors Tr14 and Tr15 having a polar same as those of the transistors Tr9 and Tr10 in parallel is provided. Further, a gate of the transistor Tr14 is connected to the gate of the transistor Tr9, and a gate of the transistor Tr15 is connected to the gate of the transistor Tr10. Any other component therein, which is identical to the component in FIG. 1, is not described in the present embodiment.

The foregoing configuration can achieve an effect similar to that of the configuration in FIG. 6, and eliminates the need to provide the highly precise resistance element used in the configuration of FIG. 6.

For reference, as a possible configuration, the configurations from FIG. 2 through FIG. 7 can be combined with one another.

Embodiment 3

An embodiment 3 of the present invention is capable of controlling more effectively the waveform distortion compared to the embodiment 1.

Figure 8:
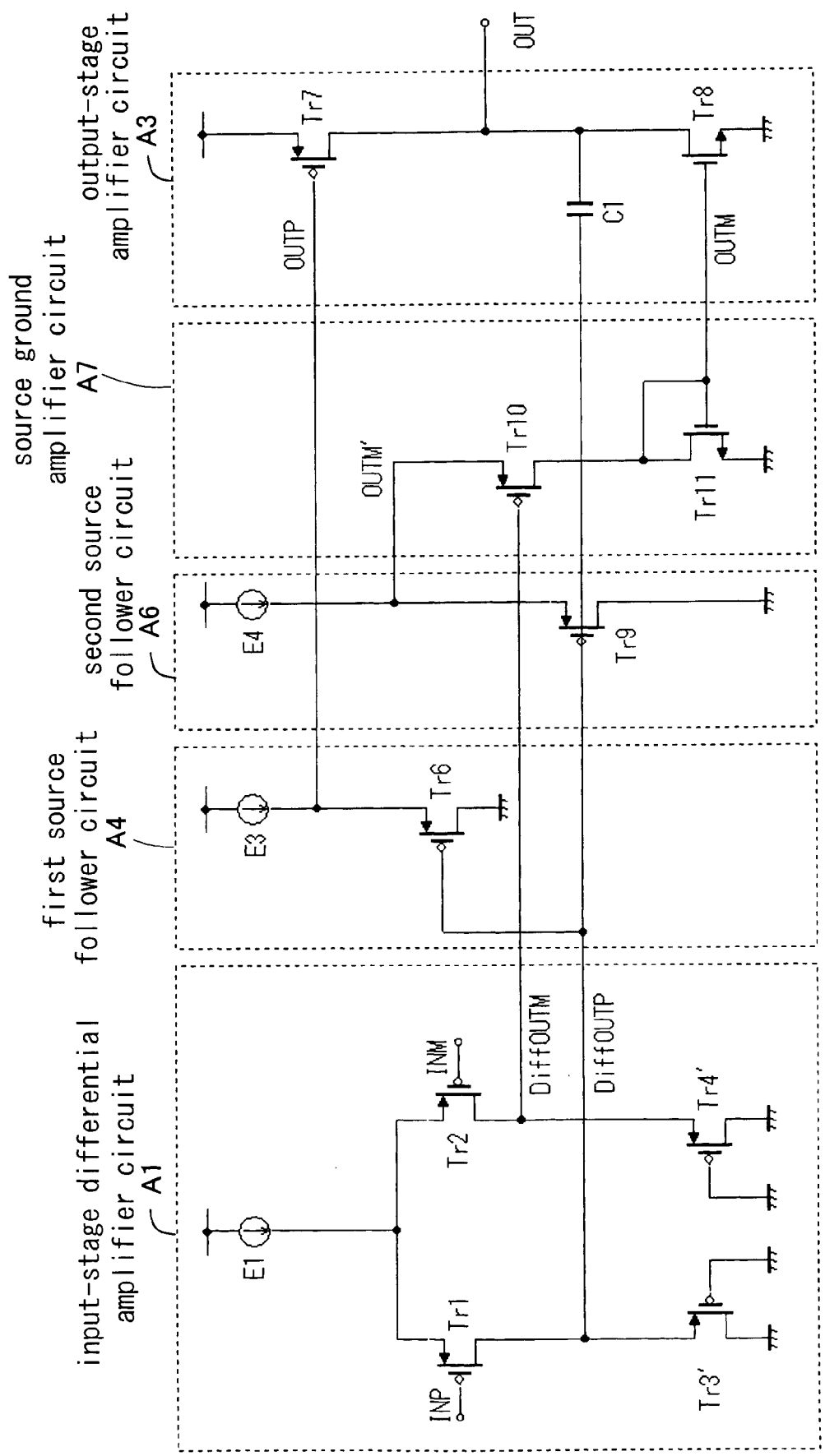
FIG. 8 is a circuit diagram illustrating an example 1 of a configuration of a differential amplifier according to an embodiment 3 of the present invention.

Referring to a differential amplifier shown in FIG. 8, in the differential amplifier circuit A1, transistors Tr3' and Tr4' for load resistance have a polar same as those of the input transistors Tr1 and Tr2, and has a diode structure with respective gates and drains thereof (ground) being connected to each other. Any other component therein, which is identical to the component in FIG. 1, is not described in the present embodiment.

According to the foregoing configuration, a non-linearity of the differential pair (Tr1 and Tr2) is negated by a non-linearity of a differential pair (Tr3' and Tr4'). In this manner, the linearity of the differential pair can be enhanced to thereby further improve the waveform. Further, it becomes unnecessary to provide a common mode feedback circuit, which is generally necessarily provided outside the differential amplifier.

The configuration of FIG. 8 is based on the configuration of FIG. 1, and it is possible to apply the skill described with reference to FIG. 8 to any of the differential amplifiers shown in FIGS. 2 through 7.

Embodiment 4

An embodiment 4 of the present invention achieves an operation with a voltage lower than in the embodiment 1.

Figure 9:
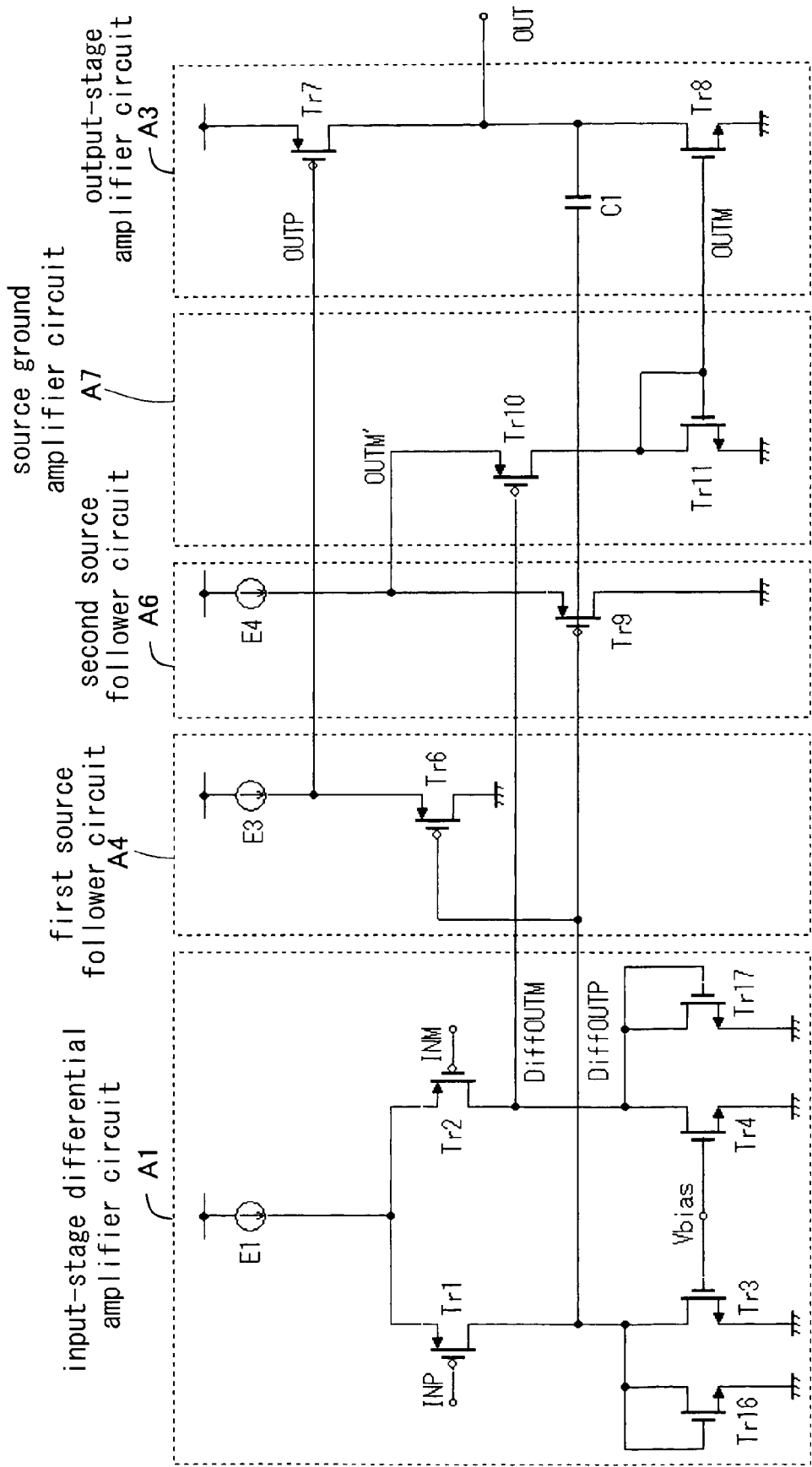
FIG. 9 is a circuit diagram illustrating an example 2 of a configuration of the differential amplifier according to the embodiment 3.

Referring to a differential amplifier shown in FIG. 9, in the differential amplifier circuit A1, transistors Tr16 and Tr17 having the diode structure, wherein gates and drains are respectively connected to each other, are connected to the drains of the transistors Tr3 and Tr4 for load resistance. The transistors Tr16 and Tr17 serve as a bypath for a current running through the transistors Tr3 and Tr4. Any other component therein, which is identical to the component in FIG. 1, is not described in the present embodiment.

According to the foregoing configuration, a resistance value of a load resistance portion is decreased. Therefore, a current of the constant current source E1 can be ensured despite a lowered power-source voltage, and a differential gain of the differential amplifier circuit A1 is increased. As a result, the differential amplifier can be driven with a lower voltage.

Figure 10:
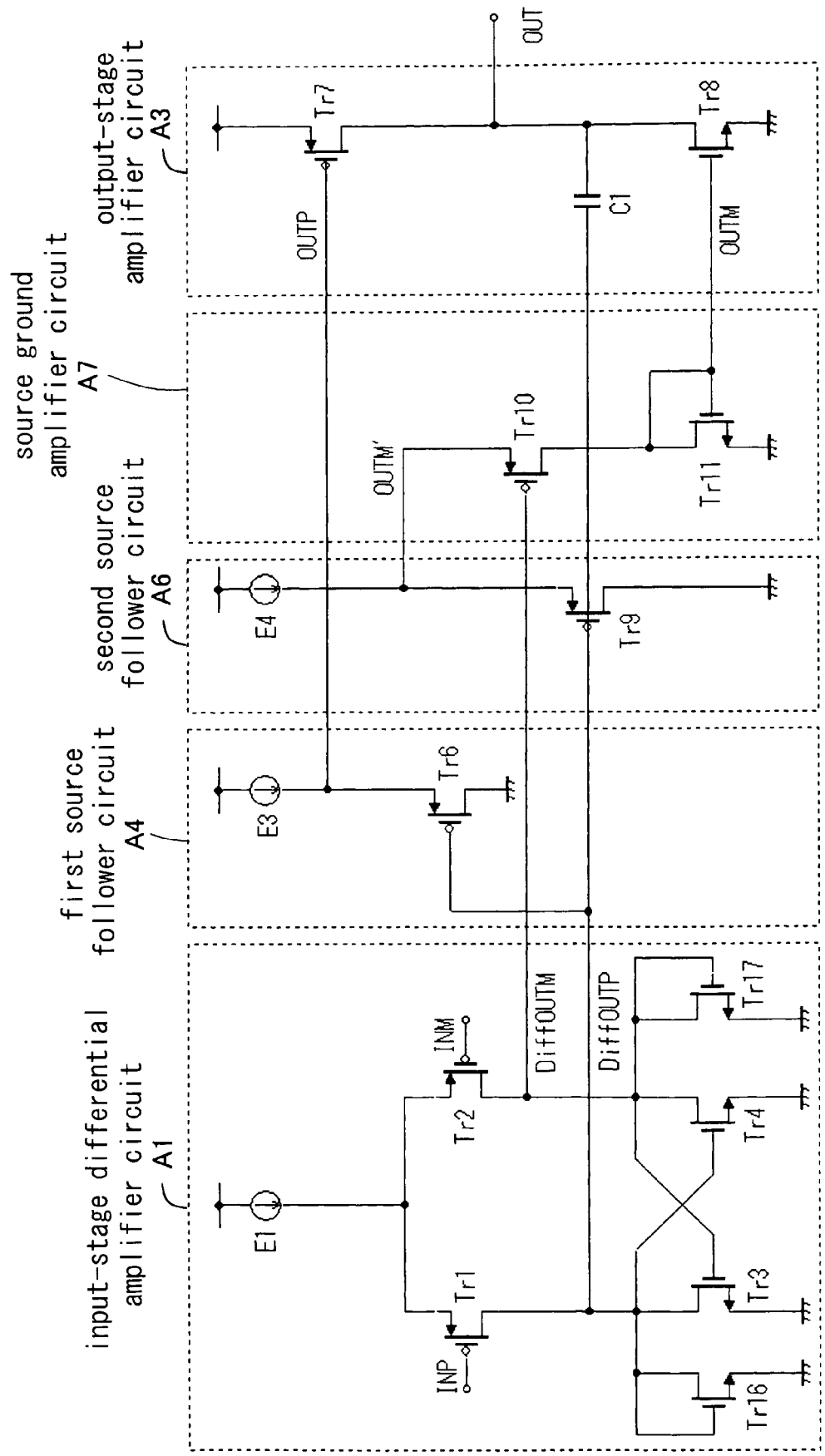
FIG. 10 is a circuit diagram illustrating a configuration of a differential amplifier according to an embodiment 4 of the present invention.

A differential amplifier shown in FIG. 10 constitutes the configuration of FIG. 9 including the further arrangement that a gate of the transistor Tr3 is connected to the drain of the transistor Tr4, and a gate of the transistor Tr4 is connected to the drain of the transistor Tr3.

The foregoing configuration can achieve an effect similar to that of the configuration shown in FIG. 9, and further prevent the decrease of the open gain of the differential amplifier circuit A1 compared to the configuration of FIG. 9.

The configurations of FIGS. 9 and 10 are based on the configuration of FIG. 1, and it is possible to apply the skills described with reference to FIGS. 9 and 10 to any of the differential amplifiers shown in FIGS. 2 through 8.

Embodiment 5

According to an embodiment 5 of the present invention, a frequency band of a differential amplifier is improved.

Figure 11:
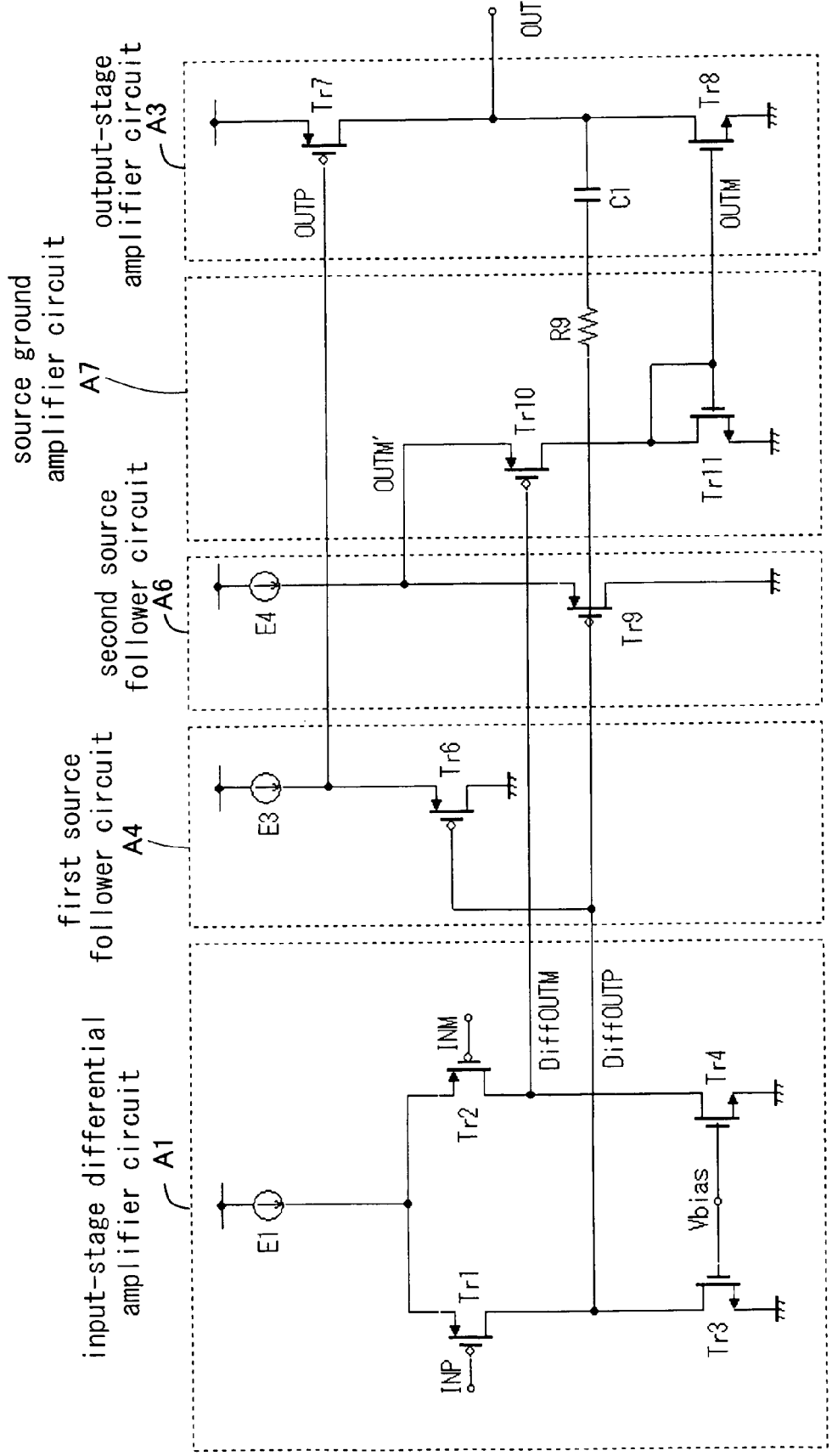
FIG. 11 is a circuit diagram illustrating a configuration of a differential amplifier according to an embodiment 5 of the present invention.

In a differential amplifier shown in FIG. 11, a zero-point compensation resistance R9 as a zero-point compensation circuit is inserted so as to connect the phase compensation capacity C1 of the output-stage amplifier circuit A3 and the terminal for the first output signal DiffOUTP of the differential amplifier circuit A1. Any other component therein, which is identical to the component in FIG. 1, is not described in the present embodiment.

According to the foregoing configuration, a zero point appearing near a home position as a result of the phase compensation performed by a phase compensation capacity C1 is separated from the home position again by means of the zero-point compensation resistance R9. This consequently improves the frequency band.

The configuration of FIG. 11 is based on the configuration of FIG. 1, and it is possible to apply the skill described with reference to FIG. 11 to any of the differential amplifiers shown in FIGS. 2 through 10.

Embodiment 6

An embodiment 6 of the present invention relates to an improvement of impedance matching.

Figure 12:
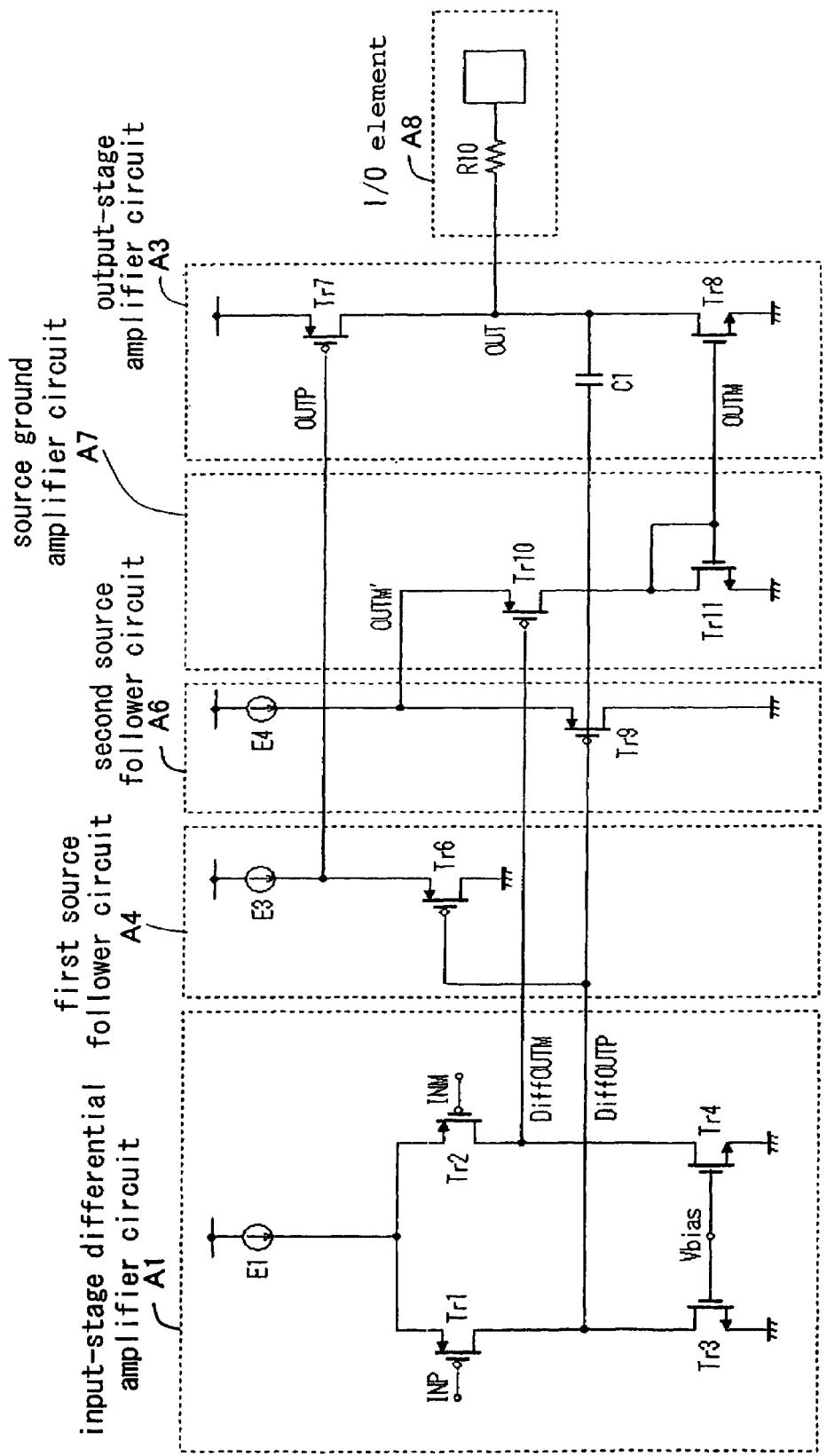
FIG. 12 is a circuit diagram illustrating a configuration of a differential amplifier according to an embodiment 6 of the present invention.

In a differential amplifier shown in FIG. 12, to the output-stage amplifier circuit A3 is connected an I/O element A8 with an output impedance adjustment resistance R10 capable of a constant output impedance (for example, 50Ω) provided therein. Any other component therein, which is identical to the component in FIG. 1, is not described in the present embodiment.

According to the foregoing configuration, when the differential amplifier is used as a driver amplifier, it becomes easier to perform the impedance matching, thereby facilitating a design of a transmission passage.

The configuration of FIG. 12 is based on the configuration of FIG. 1, and it is possible to apply the skill described with reference to FIG. 12 to any of the differential amplifiers shown in FIGS. 2 through 11.

For reference, in the embodiments 1 through 6, the first polarity is represented by the P channel, and the second polarity is represented by the N channel. On the contrary, the first polarity may be represented by the N channel, and the second polarity may be represented by the P channel, in which case a similar effect can be achieved.

Embodiment 7

Figure 13:
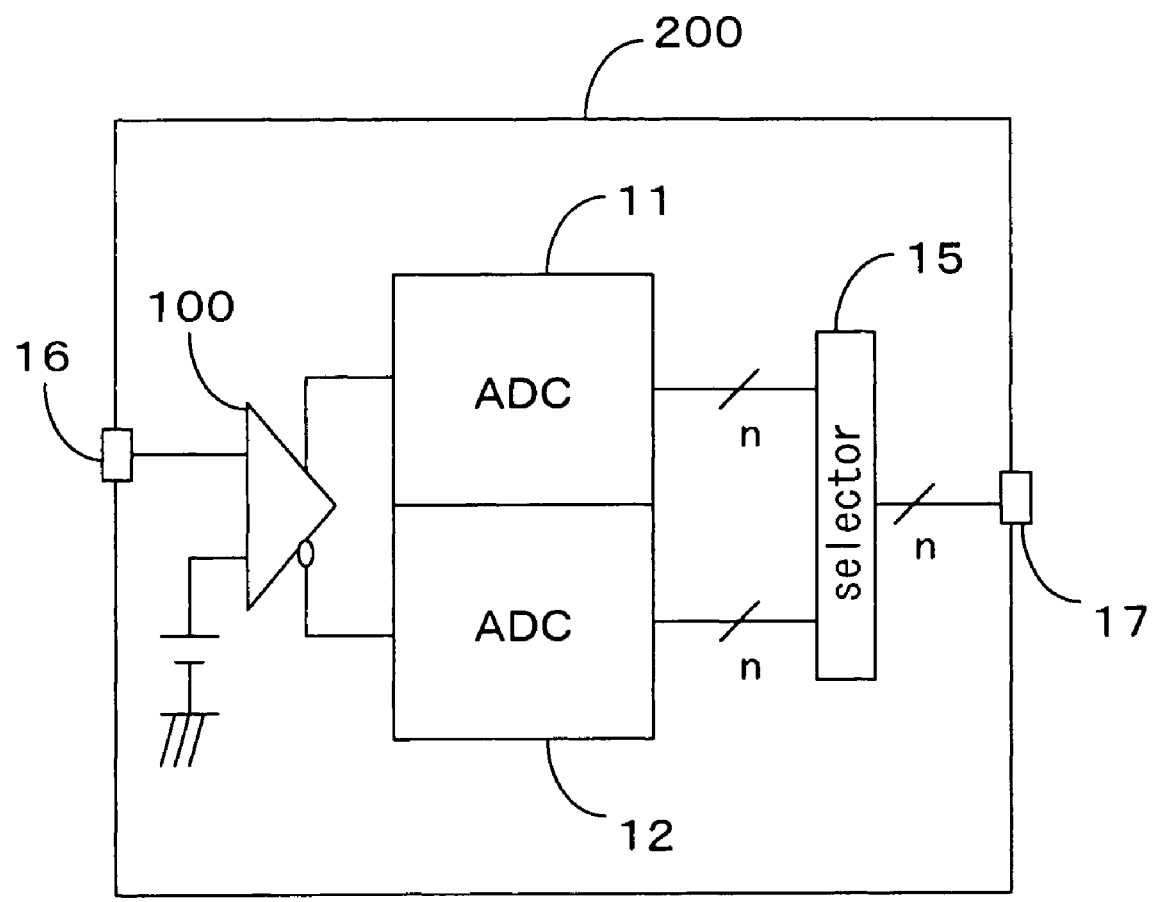
FIG. 13 is a block diagram illustrating a configuration of a test circuit of an ADC (A/D circuit) according to an embodiment 7 of the present invention.
Figure 14:
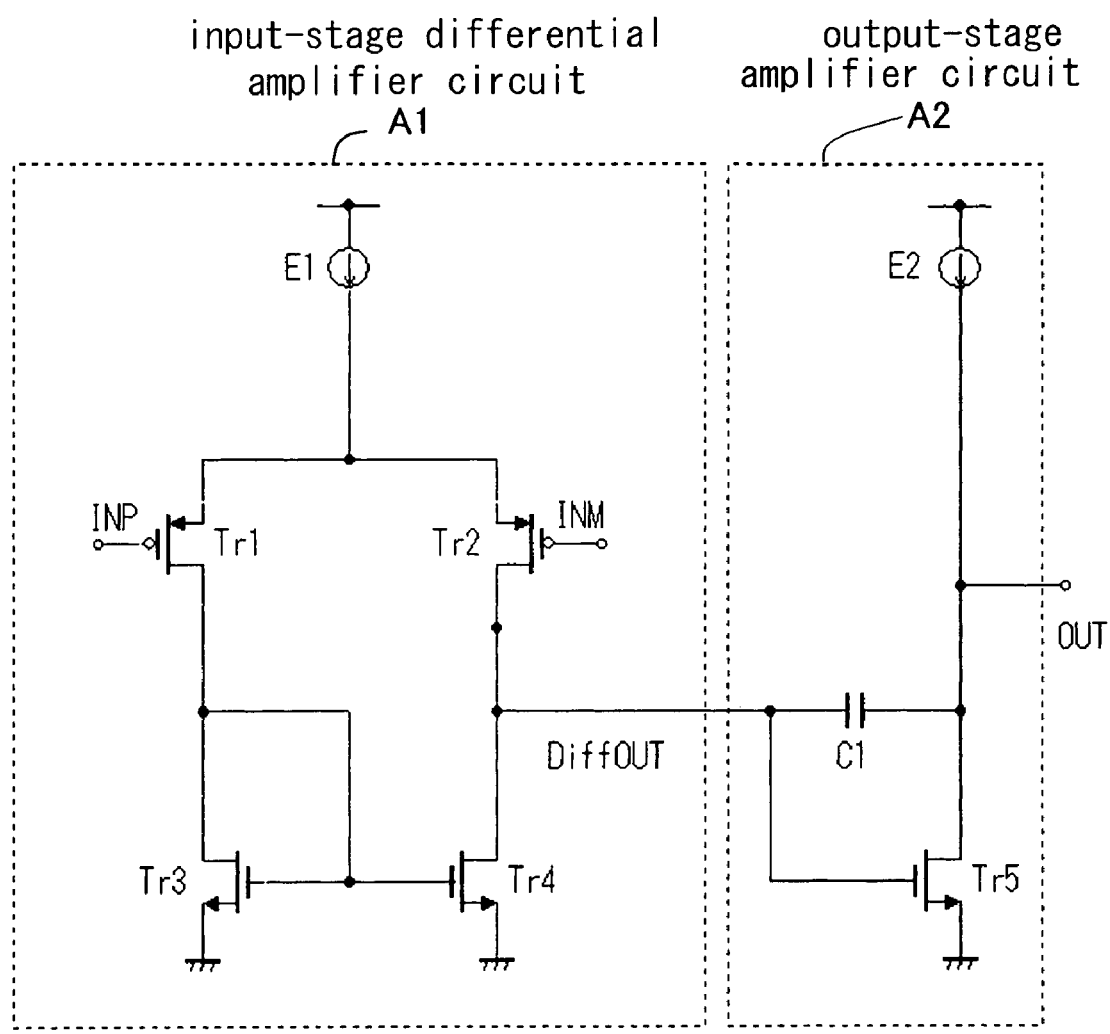
FIG. 14 is a circuit diagram illustrating a configuration of a differential amplifier capable of class A output according to a conventional technology.
Figure 15:
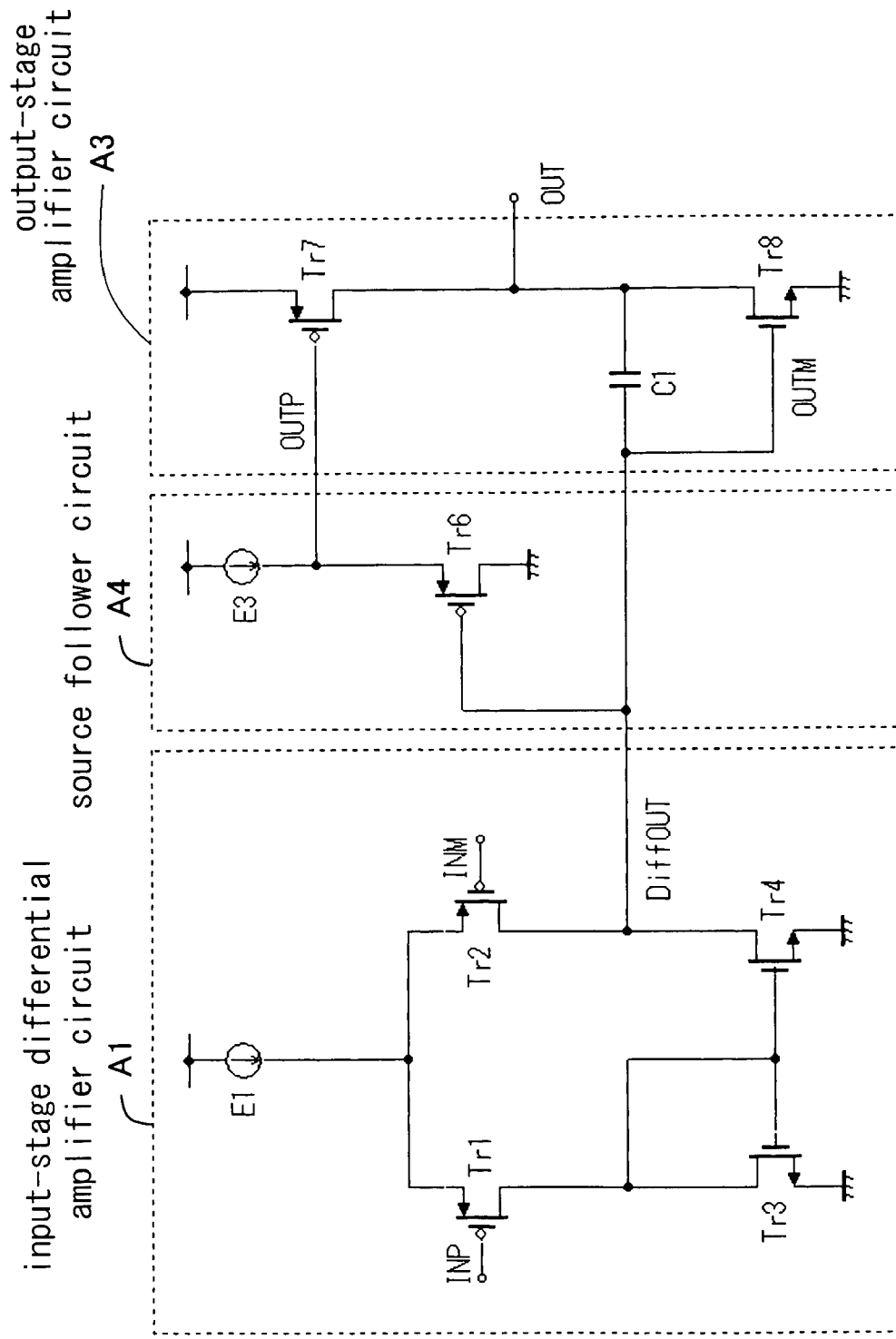
FIG. 15 is a circuit diagram illustrating a configuration of a differential amplifier capable of class AB output according to a conventional technology.
Figure 16:
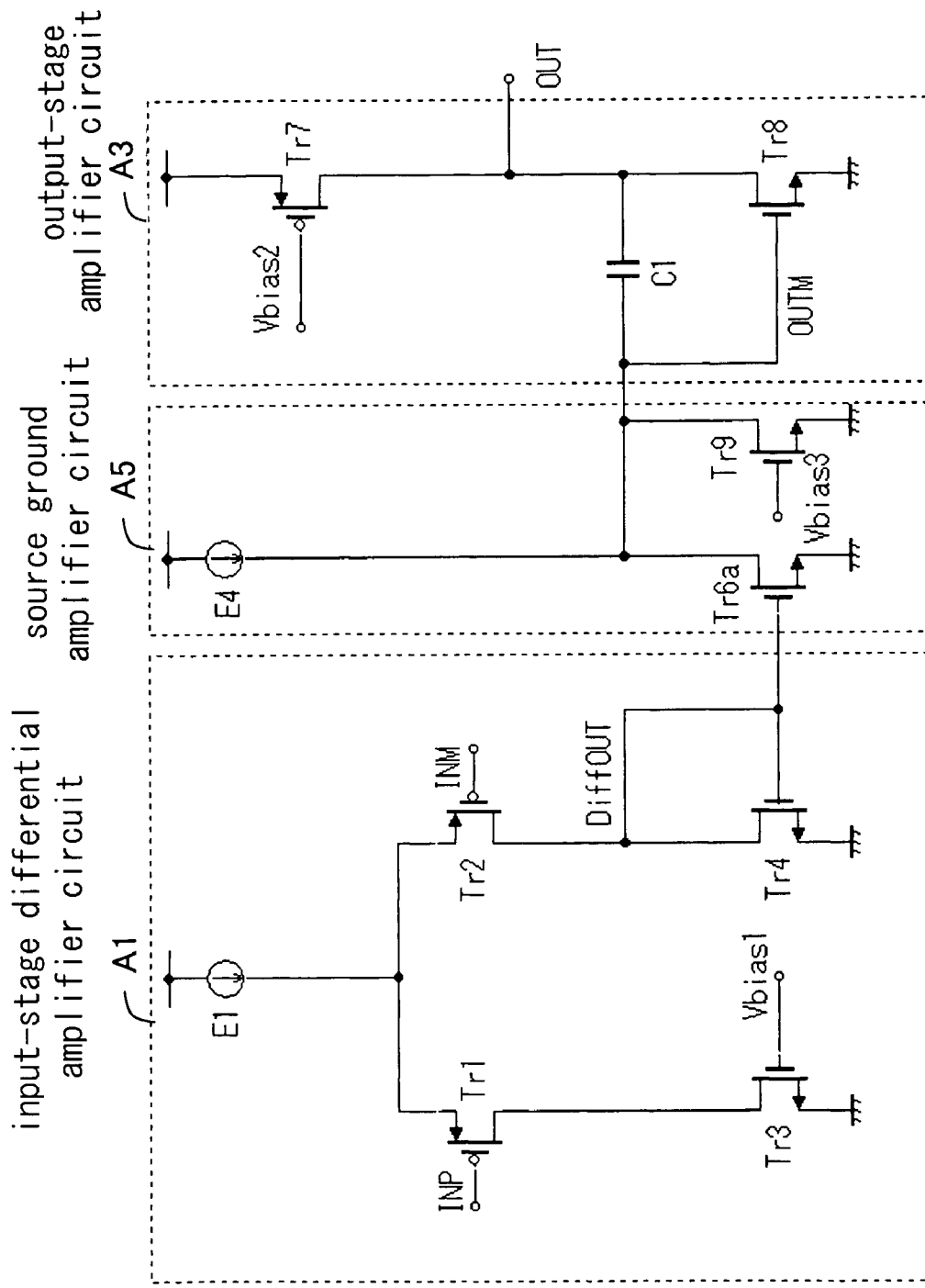
FIG. 16 is a circuit diagram illustrating a configuration of a differential amplifier according to another conventional technology.

As described, a differential amplifier according to the present invention exerts an effect of mitigating a limitation with respect to the amplitude and band of a signal. Based on that, as shown in FIG. 13, a differential amplifier 100 according to any of the embodiments so far described is incorporated into an input of an LSI 200 with multi-channel ADCs (A/D converter) 11 and 12 installed therein. Reference numerals 15, 16 and 17 are respectively a selector, an input terminal, and an output terminal.

Figure 17:
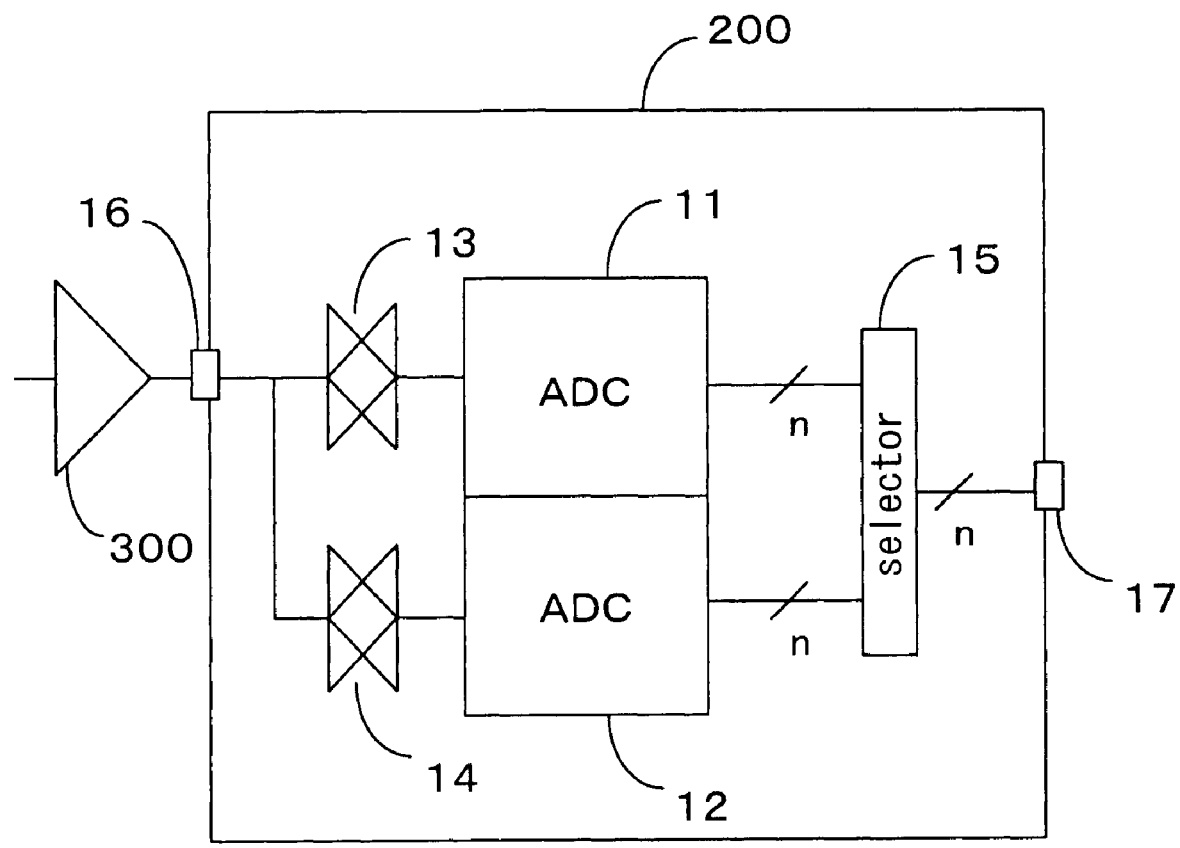
FIG. 17 is a block diagram illustrating a configuration of a test circuit of a conventional ADC.

FIG. 17 is a comparative example, in which case an input buffer 300 for shaping an input signal is externally connected to the LSI 200, and analogue switches 13 and 14 are internally connected to the ADCs 11 and 12 of the LSI 200.

In the course of testing a characteristic of the multi-channel ADCs, a test signal inputted from an LSI tester is limited in amplitude when expanded in band. Therefore, it is essential to provide an input buffer having an amplifying function, whereas an ON-resistance of the switches 13 and 14 becomes a disadvantage in expanding the band of the test signal.

In contrast to that, according to the configuration of FIG. 13, the ADCs can be tested with any limitation to the amplitude and band of the signal. Another advantage is that the external connection of the input buffer can be eliminated to thereby reduce a cost for the test. This technology is advantageous to an LSI having a built-in ADC of a video signal band level.

This technology is applicable not only to the test for the multi-channel ADC, but also to tests for a multi-channel DAC (D/A converter) and differential ADC and DAC achieving a similar effect.

The present invention is not limited to the foregoing embodiments, and various modifications within the scope of its technical idea can be implemented.

What is claimed is:

1. A differential amplifier comprises:
   an input-stage differential amplifier circuit having a first and a second input terminals and a first and a second output terminals;
   a first source follower circuit having a first-polar transistor, wherein the first output terminal of the differential amplifier circuit is connected to a gate;
   a second source follower circuit having a first-polar transistor, wherein the first output terminal of the differential amplifier circuit is connected to a gate;
   a source ground amplifier circuit having a first-polar transistor, wherein an output terminal of the second source follower circuit is connected to a source, the second output terminal of the differential amplifier circuit is connected to a gate, and a load resistance is connected to a drain; and
   an output-stage amplifier circuit comprised of a first-polar transistor, wherein an output terminal of the first source follower circuit is connected to a gate, and a second-polar transistor, wherein an output terminal of the source ground amplifier circuit is connected to agate, serially connected to each other.

2. A differential amplifier as claimed in claim 1, wherein the differential amplifier circuit comprises:
   a constant current source;
   a first-polar first input transistor, wherein a source is connected to the constant current source and the first input terminal is connected to a gate;
   a first-polar second input transistor, wherein a source is connected to the constant current source and the second input terminal is connected to a gate;
   a first load resistance connected to a drain of the first input transistor; and
   a second load resistance connected to a drain of the second input transistor.

3. A differential amplifier as claimed in claim 2, wherein linear resistances are respectively inserted between the source of the first input transistor and the constant current source, and between the source of the second input transistor and the constant current source in the differential amplifier circuit.

4. A differential amplifier as claimed in claim 1, wherein the differential amplifier circuit comprises:
   a first constant current source;
   a second constant current source;
   a first-polar first input transistor, wherein a source is connected to the first constant current source and the first input terminal is connected to a gate;
   a first-polar second input transistor, wherein a source is connected to the second constant current source and the second input terminal is connected to a gate;
   a first load resistance connected to a drain of the first input transistor;
   a second load resistance connected to a drain of the second input transistor; and
   a linear resistance inserted between the source of the first input transistor and the source of the second input transistor.

5. A differential amplifier as claimed in claim 4, wherein
the linear resistance inserted between the sources of the first and second input transistors in the differential amplifier circuit are comprised of a parallel connection unit of two transistors, and gates of the parallel connection unit are respectively connected to the first and second input terminals.

6. A differential amplifier as claimed in claim 2 or claim 4, wherein
the first and second load resistances in the differential amplifier circuit are comprised of diode connectors of transistors.

7. A differential amplifier as claimed in claim 2 or claim 4, wherein
sub load resistances are respectively connected in parallel to the first and second load resistances in the differential amplifier circuit.

8. A differential amplifier as claimed in claim 7, wherein
the respective sub load resistances in the differential amplifier circuit are comprised of diode connectors of transistors.

9. A differential amplifier as claimed in claim 6, wherein
in the diode connectors comprising the first and second load resistances in the differential amplifier circuit, a gate of one of the diode connectors is connected to a drain of the other, and a drain of one of the diode connectors is connected to a gate of the other.

10. A differential amplifier as claimed in claim 1, wherein
the load resistance in the source ground amplifier circuit is comprised of a diode connector of the second-polar transistor.

11. A differential amplifier as claimed in claim 1, wherein
linear resistances are respectively inserted between a source of the first-polar transistor in the second source follower circuit and a constant current source, and between a source of the first-polar transistor in the source ground amplifier circuit and the constant current source.

12. A differential amplifier as claimed in claim 1, wherein
a linear resistance comprised of a parallel connection unit of transistors, wherein gates are respectively connected to the first and second output terminals of the differential amplifier circuit, is inserted between a connection point, at which a source of the first-polar transistor in the second source follower circuit and a constant current source are connected to each other, and a connection point, at which a source of the first-polar transistor in the source ground amplifier circuit and the constant current source are connected to each other.

13. A differential amplifier as claimed in claim 1, wherein
a zero-point compensation circuit is inserted between an output terminal of the output-stage amplifier circuit and the first output terminal of the differential amplifier circuit.

14. A differential amplifier as claimed in claim 1, wherein
a resistance element for adjusting an output impedance is connected to an output terminal of the output-stage amplifier circuit.

15. An LSI test circuit incorporating a differential amplifier as claimed in any of claims 1 through 5 as an input amplifier for test use.

16. An LSI test circuit incorporating a differential amplifier as claimed in claim 6 as an input amplifier for test use.

17. An LSI test circuit incorporating a differential amplifier as claimed in claim 7 as an input amplifier for test use.

18. An LSI test circuit incorporating a differential amplifier as claimed in any of claims 8 through 14 as an input amplifier for test use.

19. An LSI test circuit incorporating a differential amplifier as claimed in any of claims 1 through 5 as an output amplifier for test use.

20. An LSI test circuit incorporating a differential amplifier as claimed in claim 6 as an output amplifier for test use.

21. An LSI test circuit incorporating a differential amplifier as claimed in claim 7 as an output amplifier for test use.

22. An LSI test circuit incorporating a differential amplifier as claimed in any of claims 8 through 14 as an output amplifier for test use.

* * * * *